US011190175B2

(12) United States Patent
Miller et al.

(10) Patent No.: US 11,190,175 B2
(45) Date of Patent: Nov. 30, 2021

(54) COMPARATOR DIAGNOSTIC SYSTEMS AND METHODS

(71) Applicant: Maxim Integrated Products, Inc., San Jose, CA (US)

(72) Inventors: Daniel James Miller, Gilbert, AZ (US); Brian A. Miller, Gilbert, AZ (US); Syed Aftab, Gilbert, AZ (US); Daniel David Alexander, Mesa, AZ (US); Jason R. Ferguson, Mesa, AZ (US)

(73) Assignee: Maxim Integrated Products, Inc., San Jose, CA (US)

( * ) Notice: Subject to any disclaimer, the term of this patent is extended or adjusted under 35 U.S.C. 154(b) by 232 days.

(21) Appl. No.: 16/504,931

(22) Filed: Jul. 8, 2019

(65) Prior Publication Data

US 2020/0021280 A1 Jan. 16, 2020

Related U.S. Application Data

(60) Provisional application No. 62/696,223, filed on Jul. 10, 2018.

(51) Int. Cl.
| | |
|---|---|
| *H02H 3/00* | (2006.01) |
| *H03K 5/24* | (2006.01) |
| *H03M 1/38* | (2006.01) |
| *H03F 3/45* | (2006.01) |
| *H02H 3/20* | (2006.01) |
| *H02H 1/00* | (2006.01) |

(52) U.S. Cl.
CPC ............. *H03K 5/24* (2013.01); *H02H 1/0007* (2013.01); *H02H 3/207* (2013.01); *H03F 3/45475* (2013.01); *H03M 1/38* (2013.01)

(58) Field of Classification Search
None
See application file for complete search history.

(56) References Cited

U.S. PATENT DOCUMENTS

| | | | | |
|---|---|---|---|---|
| 7,352,307 | B2 * | 4/2008 | Iorgulescu | H03M 1/1019 327/307 |
| 7,728,747 | B2 * | 6/2010 | Iorgulescu | H03M 1/1019 341/118 |
| 8,593,315 | B2 * | 11/2013 | Yamase | H03M 1/0656 341/118 |
| 9,780,763 | B1 * | 10/2017 | Lu | H03K 5/24 |

* cited by examiner

*Primary Examiner* — Stephen W Jackson
(74) *Attorney, Agent, or Firm* — North Weber & Baugh LLP; Michael V. North

(57) ABSTRACT

An analog front-end circuit for self-calibrating a comparator, the circuit comprising a comparator in a comparator measurement path; a preamplifier coupled to the comparator by a set of switches; and an amplifier coupled to the preamplifier, the preamplifier receiving a reference signal as a first input and a user-definable reference as a second input, the user-definable reference generating a user-definable value chosen to create a known condition at an output of the preamplifier, the preamplifier determines a residual value that represents a measurement error in a signal path comprising the comparator and is used to adjust the user-definable reference value to calibrate the signal path such that threshold boundaries for the comparator can be adjusted to tighten a comparator specification.

20 Claims, 4 Drawing Sheets

COMPARATOR DIAGNOSTIC SYSTEMS AND METHODS

CROSS-REFERENCE TO RELATED APPLICATIONS

This patent application is related to and claims priority benefit under 35 U.S.C. § 119(e) to commonly-owned U.S. Provisional Patent Application No. 62/696,223, entitled "COMPARATOR DIAGNOSTIC SYSTEMS AND METHODS," naming as inventors Daniel James Miller, Brian A. Miller, Syed Aftab, Daniel David Alexander, and Jason Ferguson, and filed Jul. 10, 2018, which application is incorporated by reference herein in its entirety and for all purposes.

A. TECHNICAL FIELD

The present disclosure generally relates to electrical data acquisition systems and methods. More specifically, the present disclosure relates to data acquisition systems comprising independent, redundant measurement paths.

B. BACKGROUND

Typical data acquisition systems consist of a measurement circuit, e.g., a comparator or an Analog-Digital Converter (ADC) that can be used to measure a desired voltage or current. For safety critical applications, e.g., a system designed to monitor stacked battery voltages in a car, an alternate, redundant measurement path is typically required to verify the results. It may be required that the redundant measurement path is a different architecture than the first, thus, improving robustness of the design, e.g., a successive approximation register (SAR) ADC main path, and a comparator redundant path.

Having redundant measurement paths can be expensive in terms of cost and power consumption. It may be necessary to reduce the accuracy of the redundant measurement path to reduce the cost and power consumption. A comparator may be used as the redundant path since comparators can often be designed using a smaller number of components or current than an ADC.

As a result of the comparator accuracy drift over time, due to temperature changes or material aging effects, the overall accuracy of the redundant path likewise decreases. In certain applications, especially in safety-critical applications, it is desirable to tightly constrain the allowable drift in order to ensure the integrity of the redundant circuit comparison result. Common calibration techniques for comparator circuits involve complex circuitry and cumbersome methods that use, e.g., a SAR search algorithm to accurately determine when a comparator crosses a known voltage.

Binary search algorithms typically apply a known fixed voltage to one input of the comparator and a Digital-Analog Converter (DAC) output to the other input. The DAC is swept until the comparator changes states. After detecting a change in the comparator output state, the output voltage of the DAC is compared against the fixed input voltage to determine the accuracy of the comparator. When the error is known, the comparator can be adjusted to compensate for the error. In practice, architectures that employ this type of SAR-type search algorithms for calibration or diagnostic purposes are time-consuming and difficult to implement.

Accordingly, it is desirable to have systems and methods that can diagnose and improve the performance of a comparator without the unnecessarily complex implementation of a SAR calibration routine for sweeping DAC voltages.

SUMMARY

Various embodiments comprise an analog front-end circuit for self-calibrating a comparator, comprising: a comparator in a comparator measurement path; a preamplifier coupled to the comparator by a set of switches; and an amplifier coupled to the preamplifier, the preamplifier receiving a reference signal as a first input and a user-definable reference as a second input, the user-definable reference generating a user-definable value chosen to create a known condition at an output of the preamplifier, the preamplifier determines a residual value that represents a measurement error in a signal path comprising the comparator and is used to adjust the user-definable reference value to calibrate the signal path such that threshold boundaries for the comparator can be adjusted to tighten a comparator specification. Embodiments comprise one or more of the following features: The circuit further comprising one or more switches configured to decouple the preamplifier from the comparator to perform a calibration operation. The reference signal and an ADC may be decoupled from the preamplifier in regular operation. The circuit may further comprise a programmable data register that generates a digital input word and a register that stores a measured error. The circuit may further comprise a reference voltage buffer that generates the reference signal as an analog voltage. In a diagnostic phase, a DAC may receive the reference signal and generate the user-definable reference. The user-definable value when multiplied by a first input gain of the preamplifier is substantially equal to the amplifier output multiplied by a second input gain of the preamplifier.

Various embodiments comprise a method for self-calibrating a comparator in an analog front-end circuit, the method comprising: providing a reference as a first input to an amplifier; providing a user-definable reference value as a second input to the amplifier, the user-definable reference value chosen to create a known condition at an output of a preamplifier; measuring the output of the preamplifier to determine a residual value that represents a measurement error in a comparator signal path; based on the residual value, adjusting the user-definable reference value to calibrate the comparator signal path; and changing threshold boundaries for a comparator to tighten a specification for the comparator. Implementations may comprise one or more of the following features: The method where the user-definable reference is used to define or trigger at least one of an overvoltage threshold or an undervoltage threshold. The user-definable reference may be used to define or trigger a component failure alert. The method may further comprise, in regular operation, decoupling an ADC in the analog front-end circuit and the reference from the amplifier, and using the ADC to test an accuracy of the comparator and perform on-demand calibration to improve comparator accuracy and performance. The method may further comprise decoupling the preamplifier from the comparator to perform a calibration operation, and, in a diagnostic phase, provide the reference signal to a DAC that generates the user-definable reference. The method may comprise using a reference voltage buffer that generates the reference signal as an analog voltage and may further comprise automatically changing the user-definable reference value from an initial value.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE EMBODIMENTS

Figure 1:
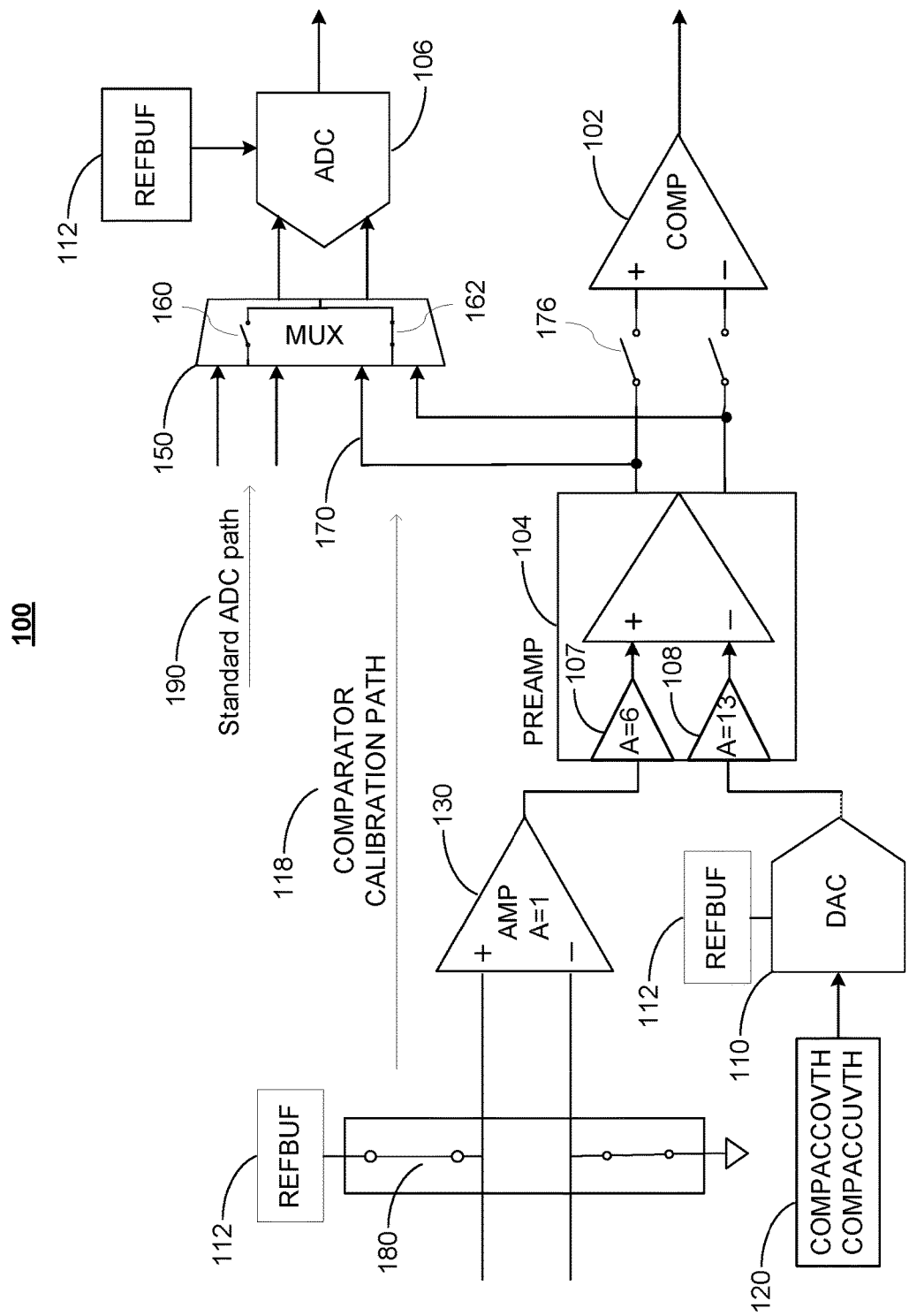
FIG. 1 is a functional block diagram illustrating an analog front-end circuit comprising a comparator diagnostic circuit that utilizes a comparator calibration path according to various embodiments of the present disclosure.

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

Components, or modules, shown in diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated. Furthermore, the use of memory, database, information base, data store, tables, hardware, and the like may be used herein to refer to system component or components into which information may be entered or otherwise recorded.

Furthermore, it shall be noted that while the embodiments described herein are given in the context of front-end amplifiers, one skilled in the art will recognize that the teachings of the present disclosure are not limited to front-end amplifier applications and may equally be used in other circuit architectures that involve comparators that would benefit from the calibration systems and methods of the present disclosure.

FIG. 1 is a functional block diagram illustrating an analog front-end circuit comprising a comparator diagnostic circuit that utilizes a comparator calibration path according to various embodiments of the present disclosure. In embodiments, circuit 100 comprises comparator 102, preamplifier 104, analog-to-digital converter (ADC) 106, digital-to-analog converter (DAC) 110, reference buffer 112, data register 120, amplifier 130, multiplexer 150, and standard ADC path 190. In embodiments, circuit 100 may comprise switches 176 that may be used to decouple preamplifier 104 from comparator 120, e.g., to perform a calibration operation. In embodiments, comparator calibration path 118 in configuration 100 comprises reference voltage buffer 112, amplifier 130, preamplifier 104, multiplexer 150 that comprises switches 160, 162, and ADC 106.

Reference buffer 112 may be an analog voltage source that is embedded into circuit 100 or external to circuit 100. In embodiments, reference buffer 112 may create a known, fixed analog voltage (e.g., 2.307 V) that, in a diagnostic phase, may serve as a reference signal for both ADC 106 and amplifier 130. In addition, reference voltage buffer 112 may serve as a full scale reference for DAC 110.

Register 120 may be a user-defined data register that, in embodiments, may be pre-programmed to a certain value, e.g., a digital input word or code, which is provided to DAC 110. DAC 110 may be implemented, e.g., as a 10-bit DAC that at its input receives the value from register 120 and converts it to an analog voltage that corresponds to the digital input and is scaled, i.e., divided down, according to the full scale of reference 112. The analog voltage generated by DAC 110 may then be supplied to input 108 of preamplifier 104. In embodiments, inputs 107, 108 of preamplifier 104 may each have a distinct gain.

ADC 106 may be implemented, e.g., as a 12-bit SAR-based ADC that uses a reference voltage that may be generated by a temperature-compensated precision voltage source (not shown). In embodiments, ADC 106 may be powered by a voltage supply and may be configured to receive the output voltage of comparator preamplifier 104, e.g., via multiplexer 150 to generate a digital representation of its analog input. Multiplexer 150 may be used to multiplex, e.g., via switch 162, the output voltage of preamplifier 104 to ADC 106.

In operation, e.g., in a calibration phase, switches 176 may be open, such that comparator 102 is not electrically coupled to preamplifier 104. Similarly, switch 160 may be open, such that ADC 106 receives no signals via standard ADC path 190. In embodiments, when circuit 100 is operated in a configuration as shown in FIG. 1, the analog output voltage of preamplifier 104 may be provided to the input of ADC 106 that converts the analog voltage to a digital measurement value that may be stored, e.g., a register (not shown), and may be further processed, as needed.

In embodiments, register 120 may be used to program DAC 110 to output a reference value that when multiplied by input gain 108 of preamplifier 104 is, ideally, equal to the output value of amplifier 130 multiplied by input gain 107 of preamplifier 104. In embodiments, the reference value is selected from a plurality of predetermined reference values that correspond to a voltage, e.g., 2.307 V, generated by reference buffer 112 that may be set to a known voltage.

As an example, amplifier 130 in FIG. 1 is shown as having a gain of 1 that is amplified by preamplifier 104 by a factor of 6 and fed into a first input of preamplifier 104. Similarly, the output voltage of DAC 110 may be scaled such that when multiplied by 13, before being fed into the second input of preamplifier 104, both inputs of preamplifier 104 assume the same value such that, ideally, they combine to cancel each other out. As a result, preamplifier 104 outputs a known zero.

In practice, the differential output of preamplifier 104 will settle to a non-zero value that presents an error that may be measured by ADC 106, e.g., at the output of preamplifier 104, in comparator calibration path 118.

In embodiments, comparator calibration path 118 establishes a connection between preamplifier 104 and ADC 106 that can measure and verify the functionality of comparator 102, e.g., against predetermined specification values. In addition, ADC 106 may be used to verify whether comparator 102 operates according to specified values. As will be discussed in greater detail with reference to FIG. 2, in embodiments, the measured error may be stored, e.g., in register 120, and used to adjust values for the upper and lower threshold voltage levels of comparator 102. In embodiments, a comparator measurement path comprising comparator 102 may be calibrated based on the measured error. Advantageously, ADC 106 may be used during periods of time that ADC 106 may, otherwise, be in an idle state. Once ADC 106 completes a voltage measurement, e.g., at the input of comparator 102 to determine the measurement error, ADC 106 and reference voltage buffer 112 may be decoupled from preamplifier 104, e.g., to resume regular operation.

It is understood that the comparator diagnostic circuit illustrated in FIG. 1 is not limited to the constructional detail shown there or described in the accompanying text. For example, amplifier 130 may have a non-unity gain of, e.g., 6/13 of full scale, such that a 5 V differential input signal may be attenuated to the 2.307 V that may serve as the reference voltage for a comparison with the output voltage of DAC 110 that in FIG. 1 is 6/13 of full scale. In addition, as those skilled in the art will appreciate, ADC 106 may be replaced by any suitable measurement component, such as a second comparator. Similarly, comparator 102 may be replaced by another ADC.

Figure 2:
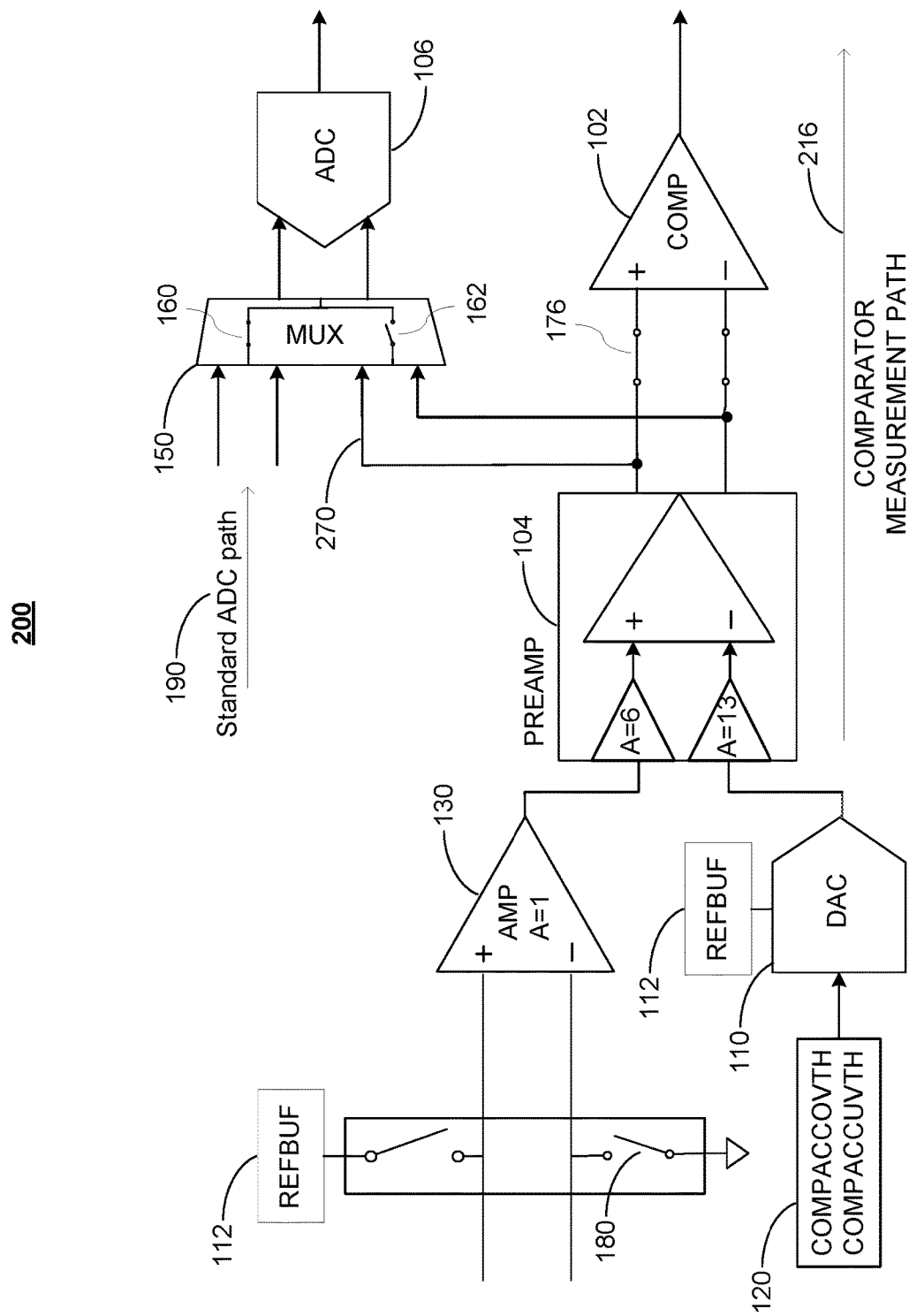
FIG. 2 is a functional block diagram illustrating comparator diagnostic circuit that utilizes a comparator accuracy path in the analog front-end circuit in FIG. 1.

FIG. 2 is a functional block diagram illustrating comparator diagnostic circuit that utilizes a comparator measurement path in the analog front-end circuit in FIG. 1. For clarity, components similar to those shown in FIG. 1 are labeled in the same manner. For purposes of brevity, a description or their function is not repeated here.

In embodiments, comparator calibration path 118 that comprises ADC 106 is more accurate than comparator measurement path 216 that comprises comparator 102. In embodiments, comparator 102 may be an analog comparator that receives a differential signal from the output of preamplifier 104 and generates a signal that is indicative of a difference between the two input signals. It is noted that connection 270 may be an internal connection that, in embodiments, is used to calibrate comparator 102, as discussed above with reference to FIG. 1.

In embodiments, once an error is determined in comparator calibration path 118, e.g., as measured by using the configuration in FIG. 1, the result may be used, e.g., in a measurement phase, to eliminate most or all of the error in comparator measurement path 216. In embodiments, this may be accomplished by adjusting, according to the error, the user-defined reference value in register 120 so as to constrain the limits of comparator 102. As a result, together, two independent paths 118, 216 enable a redundant set of checks (e.g., for as safety diagnostic) that, in embodiments, use a known error of comparator 102 to check and calibrate comparator measurement path 216, e.g., to tighten specifications, as discussed next.

In detail, in normal operation, switch 160 in FIG. 2 is closed, such that ADC 106 may receive signals, e.g., via MUX 150 in standard ADC path 190. In addition, switches 176 may be closed so as to couple comparator 102 to preamplifier 104 so as to form comparator measurement path 216 that, in embodiments, may comprise reference voltage buffer 112, DAC 110, amplifier 130, which may be configured to receive an input voltage, e.g., from battery cell (not shown), comparator 102, and preamplifier 104, which may be used to drive comparator 102 with a differential signal.

In embodiments, preamplifier 104 drives comparator 102 and receives, at one of its inputs, the output voltage of amplifier 130 and receives at its second input the reference voltage value generated by DAC 110. Preamplifier 104 applies a gain factor of, e.g., 6, to the first input and a gain factor of, e.g., 13, to the second input, and then compares these two the amplified voltages against each other in order to generate a differential output voltage that is fed into comparator 102.

In embodiments, comparator measurement path 216 may be used as a main signal path. In embodiments, in addition to verifying functionality, ADC 106 may be used to test the accuracy of comparator 102 and perform on-demand calibration, for example, to meet or exceed predetermined specification values, thereby, improving the performance and accuracy of comparator 102 beyond some initial electrical specification. In embodiments, this may be accomplished, for example, at the end of a measurement-sequence, by calculating error values for comparator measurement path 216 that then may be used to adjust (e.g., manually) upper and lower comparator threshold values of comparator 102 so as to ensure that the thresholds reflect the true performance of comparator 102.

In embodiments, register 120 may be set to, e.g., user-defined reference values that may represent an overvoltage or undervoltage threshold. Such threshold values may be used to define and trigger over-voltage, under-voltage, or component failure alerts. It is understood that these threshold values should be carefully chosen (e.g., +/−5 DAC codes) so to avoid triggering of false alerts. Overall, instead of having to build in extra safety margins to account for an unknown error, as is typically done in existing designs, using a voltage source at the input of circuit 200, a user-defined threshold in register 120, and a known residual error (i.e., knowing how far preamplifier 104 is off from zero error), advantageously allows users to make adjustments to the bounds of comparator 102, e.g., to tighten a specification by correcting thresholds in resister 120 up or down, such that comparator 102 can more closely track ADC 106.

It is noted that the reference value in register 120 may be initially set to a user-defined value and subsequently automatically changed, for example, in order to set an error limit that may be used to trigger an alarm. In embodiments, an updated error limit may be used, e.g., to tighten previously specified threshold boundaries of comparator 102.

As an example of threshold correction, if an error measured by ADC 106 is, e.g., positive 100 mV, a user-defined threshold value in register 120 may be adjusted down to a value of negative 100 mV to offset or at least partially compensate for the error to obtain a more accurate representation of comparator 102. In embodiments, the voltage values stored in register 120 may be adjusted to account for potential shifts over time, for example, due to drifts in temperature and component aging.

In embodiments, the operation of circuit 100 itself may be monitored to determine the proper circuit operation. Assuming comparator 102 operates properly but ADC 106 is off by a certain amount, a disagreement in the measurements of ADC 106 and comparator 102 would indicate that something may have shifted within circuit 100, e.g., due to some malfunction or physical defect to a component that results in the discrepancy. For example, an erroneous voltage measurement that falls outside of a range specified by a value in an ADC table, such that a known input voltage results in an elevated ADC measurement, the discrepancy that, otherwise, would remain undetected (e.g., in a circuit that only utilizes an ADC but no comparator), may be detected by comparator 102 that serves as a redundant measurement that may be used to determine the shift between the two measurement paths or some component failure.

It is understood that, in embodiments, circuit 200 may perform other and/or additional diagnostic measurements and calibrations that may be combined to verify the accuracy of components and calibrate components in circuit 200. For example, the diagnostic performed by circuit 200 may be combined with a gain calibration diagnostic that verifies that the calibration is properly functioning and, e.g., ADC 106 and amplifier 130 are operating within predetermined ranges as specified.

Overall, the use of the circuit in FIG. 1 and FIG. 2, in combination with the calibration and diagnostic techniques presented herein, facilitate a diagnostic tool that may be used to validate and/or improve the accuracy of comparator measurement path 216 and perform additional diagnostic measurements to troubleshoot various circuit components.

In effect, ADC 106 is used to calibrate comparator 102, and comparator 102 is used to gauge against ADC 106, such that one circuit component can be used to monitor the operability and/or accuracy of another circuit component, thereby, calibrating each other. The accuracy of a path comprising, e.g., a less accurate and less power-hungry (i.e., less die area) comparator 102 is compared and calibrated against the accuracy of another path comprising, e.g., a more accurate ADC 106 to determine an error that then can be reduced or completely eliminated to ensure that the ADC measurement is within the bounds of comparator 102 and that comparator 102 is maintained within relatively tight specifications.

It is noted that, in embodiments, one or more measurement techniques that utilize the circuits in FIG. 1 and FIG. 2 may operate in parallel.

Figure 3:
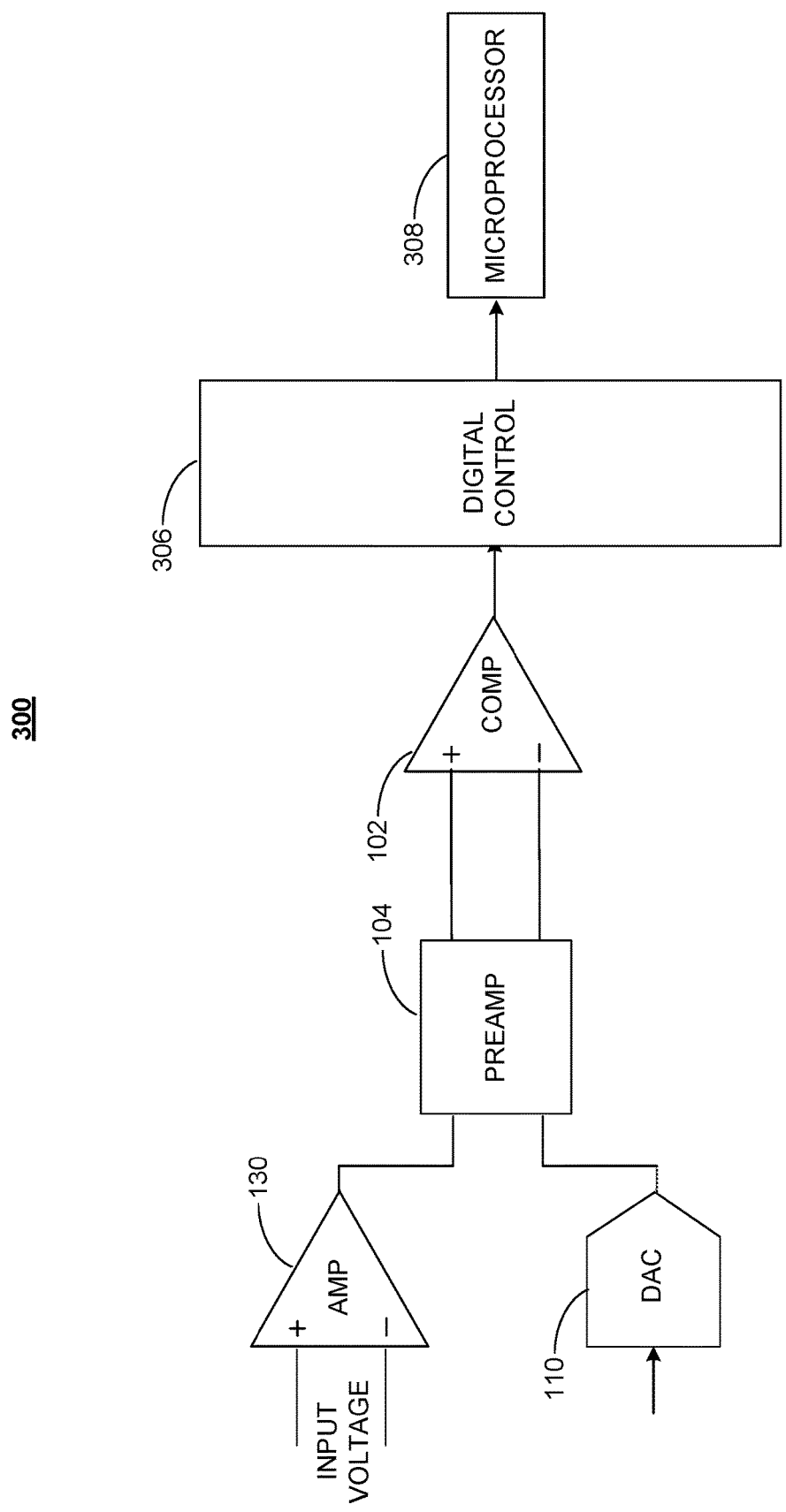
FIG. 3 is a functional block diagram illustrating an exemplary system that comprises a comparator diagnostic circuit according to various embodiments of the present disclosure.

FIG. 3 is a functional block diagram illustrating an exemplary system that comprises a comparator diagnostic circuit according to various embodiments of the present disclosure. In embodiments, system 300 comprises comparator 102, amplifier 104, DAC 110, amplifier 130, digital control 306, and microprocessor 308. Digital control 306 is a control circuit that may comprise control logic, data registers, arithmetic logic units, and the like. In embodiments, digital control 306 comprises one or more registers that may be coupled to microprocessor 308.

Once the diagnostic techniques that, in effect, switch a reference voltage in and out of a comparator signal conditioning path, as discussed above with reference to FIG. 1 and FIG. 2 have been performed, comparator 102 in system 300 may be latched to digital control 306.

In embodiments, digital control 306 may be configured to receive, store, and further process (e.g., average) the output signal generated by comparator 102. In embodiments, digital control 306 may be coupled to the same ADC (shown in FIG. 1) that is part of the comparator signal conditioning path such that the same logic component may be advantageously utilized for the dual purpose of processing both comparator and ADC signals.

In embodiments, circuit 300 is configured to measure one or more input voltages, e.g., to monitor a stack of battery cells that each produces its own voltage. Amplifier 130 may shift the relatively high input voltage of the cells to a relatively lower output voltage that can be processed by circuit 300. In addition, embodiments provide for redundancy that increases usability in safety-related applications. Advantageously, the dissimilarity of the technologies that create the diagnostic capabilities and provide the redundancy further enhances system reliability.

A person of skill in the art will appreciate that system 300 may comprise additional and/or different elements without departing from the scope of the present disclosure. For example, system 300 may comprise any number of comparator circuits that each may be coupled to digital control 308 via a multiplexer.

Figure 4:
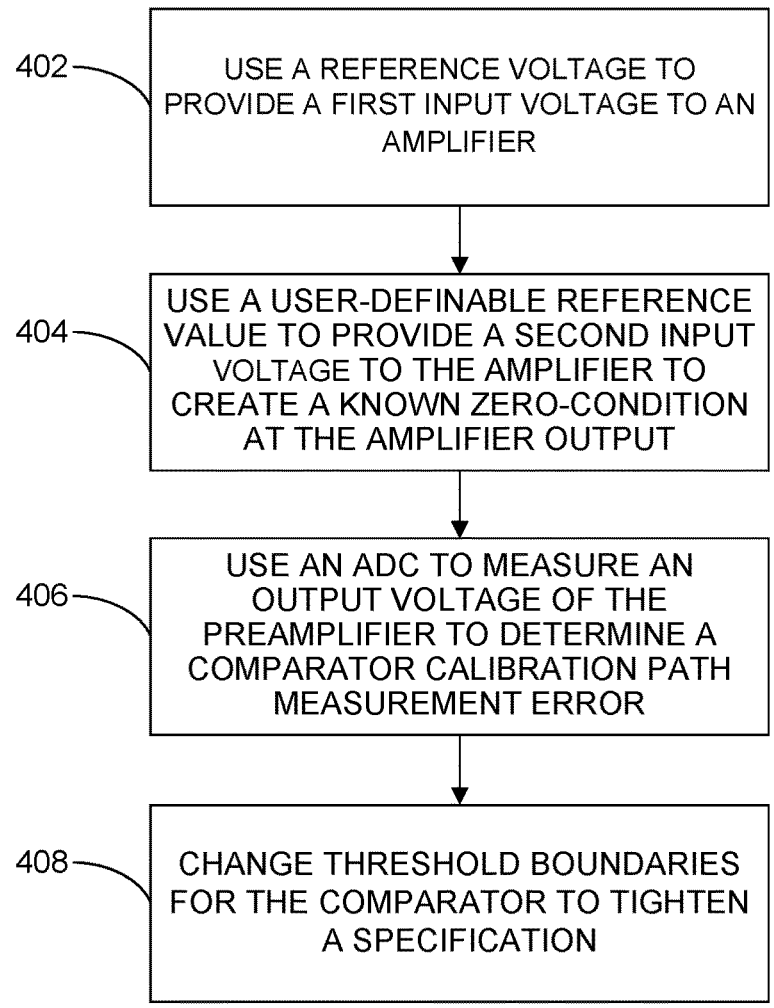
FIG. 4 is a flowchart of an illustrative process for comparator diagnostic in accordance with various embodiments of the present disclosure.

FIG. 4 is a flowchart of an illustrative process for comparator diagnostic in accordance with various embodiments of the present disclosure. Process 400 is an accuracy diagnostic that validates one path in a circuit with a second path, thus, providing for redundancy and accuracy. Process 400 starts at step 402 when a reference voltage is used to generate, e.g., at a circuit startup, as a first input voltage for an amplifier.

At step 404, a user-definable reference value is used to provide a second input voltage to the amplifier. The user-definable reference value may be chosen so as to create a known "zero" condition at the output of the amplifier.

At step 406, the output of the amplifier is measured, e.g., using an ADC to determine a residual value that represents a measurement error in a comparator calibration path. In embodiments, the comparator may be replaced by, e.g., an ADC circuit. Since the error that is to be measured is typically relatively small—and ideally zero—a common comparator may not be the preferred choice since comparators tend to have suboptimal resolution when operating at values near zero.

Finally, at step 408, the threshold boundaries for the comparator may be adjusted such as to tighten one or more comparator specification.

It is noted that: (1) certain steps may optionally be performed; (2) steps may not be limited to the specific order set forth herein; (3) certain steps may be performed in different orders; and (4) certain steps may be done concurrently.

One skilled in the art will recognize no computing system or programming language is critical to the practice of the present invention. One skilled in the art will also recognize that a number of the elements described above may be physically and/or functionally separated into sub-modules or combined together.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

The invention claimed is:

1. An analog front-end circuit for self-calibrating a comparator, the circuit comprising:
   a comparator in a comparator measurement path;
   a preamplifier coupled to the comparator by a set of switches; and
   an amplifier coupled to the preamplifier, the preamplifier receiving a reference signal as a first input and a user-definable reference as a second input, the user-definable reference generating a user-definable value chosen to create a known condition at an output of the preamplifier, the preamplifier determines a residual value that represents a measurement error in a signal path comprising the comparator and is used to adjust the user-definable reference value to calibrate the signal path such that threshold boundaries for the comparator can be adjusted to tighten a comparator specification.

2. The circuit according to claim 1, further comprising one or more switches configured to decouple the preamplifier from the comparator to perform a calibration operation.

3. The circuit according to claim 1, wherein the reference signal and an ADC are decoupled from the preamplifier in regular operation.

4. The circuit according to claim 1, further comprising a programmable data register that generates a digital input word.

5. The circuit according to claim 1, further comprising a register that stores the measurement error.

6. The circuit according to claim 1, further comprising a reference voltage buffer that generates the reference signal as an analog voltage.

7. The circuit according to claim 1, further comprising a DAC that, in a diagnostic phase, receives the reference signal.

8. The circuit according to claim 7, wherein the DAC generates the user-definable reference.

9. The circuit according to claim 1, wherein the user-definable value when multiplied by a first input gain of the preamplifier is substantially equal to the amplifier output multiplied by a second input gain of the preamplifier.

10. A method for self-calibrating a comparator in an analog front-end circuit, the method comprising:
    providing a reference as a first input to an amplifier;
    providing a user-definable reference value as a second input to the amplifier, the user-definable reference value chosen to create a known condition at an output of a preamplifier;
    measuring the output of the preamplifier to determine a residual value that represents a measurement error in a comparator signal path;
    based on the residual value, adjusting the user-definable reference value to calibrate the comparator signal path; and
    changing threshold boundaries for a comparator to tighten a specification for the comparator.

11. The method according to claim 10, wherein the user-definable reference is used to define or trigger at least one of an overvoltage threshold or an undervoltage threshold.

12. The method according to claim 10, wherein the user-definable reference is used to define or trigger a component failure alert.

13. The method according to claim 10, further comprising, in regular operation, decoupling an ADC in the analog front-end circuit and the reference from the amplifier.

14. The method according to claim 13, further comprising, using the ADC to test an accuracy of the comparator and perform on-demand calibration to improve comparator accuracy and performance.

15. The method according to claim 10, further comprising decoupling the preamplifier from the comparator to perform a calibration operation.

16. The method according to claim 10, further comprising storing the measurement error in a register.

17. The method according to claim 10, further comprising, in a diagnostic phase, providing the reference signal to a DAC that generates the user-definable reference.

18. The method according to claim 17, wherein the user-definable value when multiplied by a first input gain of the preamplifier is substantially equal to the amplifier output multiplied by a second input gain of the preamplifier.

19. The method according to claim 10, further comprising using a reference voltage buffer that generates the reference signal as an analog voltage.

20. The method according to claim 19, further comprising automatically changing the user-definable reference value from an initial value.

* * * * *